United States Patent
Klein et al.

(10) Patent No.: US 9,960,625 B2
(45) Date of Patent: May 1, 2018

(54) BATTERY MANAGEMENT SYSTEM WITH MULTIPLE OBSERVERS

(71) Applicant: Robert Bosch GmbH, Stuttgart (DE)

(72) Inventors: Reinhardt Klein, Mountain View, CA (US); Anahita MirTabatabaei, San Francisco, CA (US); Nalin Chaturvedi, Union City, CA (US); Aleksandar Kojic, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 257 days.

(21) Appl. No.: 15/087,576

(22) Filed: Mar. 31, 2016

(65) Prior Publication Data
US 2017/0288414 A1 Oct. 5, 2017

(51) Int. Cl.
*H02J 7/00* (2006.01)
*H01M 10/42* (2006.01)
(Continued)

(52) U.S. Cl.
CPC ........... *H02J 7/007* (2013.01); *H01M 10/425* (2013.01); *H01M 10/44* (2013.01); *H01M 10/48* (2013.01);
(Continued)

(58) Field of Classification Search
CPC ................................ H02J 7/007; H02J 7/0021
(Continued)

(56) References Cited

U.S. PATENT DOCUMENTS

| 7,612,532 B2 | 11/2009 | Verbrugge |
| 8,008,891 B2 | 8/2011 | Yun et al. |

(Continued)

FOREIGN PATENT DOCUMENTS

| DE | 102005008511 A1 | 8/2006 |
| EP | 2816366 A1 | 12/2014 |

(Continued)

OTHER PUBLICATIONS

Yan et al., "Lithium-ion Battery State of Charge Estimation based on Moving Horizon", Proceeding of the 11th World Congress on Intelligent Control and Automation, 2014, pp. 5002-5007, Shenyang, China.
(Continued)

*Primary Examiner* — Suchin Parihar
(74) *Attorney, Agent, or Firm* — Michael Best & Friedrich LLP

(57) ABSTRACT

A method of managing a battery system using a battery management system. The method includes receiving, measured characteristics of one or more battery cells from one or more sensors, receiving, estimated parameters of the battery cells, estimating, one or more states of the battery cells by applying a battery model based on the measured characteristics and the estimated parameters of the battery cells, updating, at least a portion of the estimated parameters based at least in part on the estimation of the states of the battery cells by applying two or more separate battery models, updating, the one or more states of the battery cells based at least in part on the updated estimated parameters of the battery cells, and regulating charging or discharging of the battery based on the updated estimation of the states of the battery cells.

20 Claims, 4 Drawing Sheets

(51) Int. Cl.
*H01M 10/44* (2006.01)
*H01M 10/48* (2006.01)

(52) U.S. Cl.
CPC ... *H02J 7/0021* (2013.01); *H01M 2010/4271* (2013.01); *H01M 2010/4278* (2013.01)

(58) Field of Classification Search
USPC .......................................................... 320/134
See application file for complete search history.

(56) References Cited

U.S. PATENT DOCUMENTS

| | | | |
|---|---|---|---|
| 8,103,485 | B2 | 1/2012 | Plett |
| 8,116,998 | B2 | 2/2012 | Hess |
| 8,188,715 | B2 | 5/2012 | Christensen et al. |
| 8,321,164 | B2 | 11/2012 | Liu et al. |
| 8,346,495 | B2 | 1/2013 | Gering |
| 8,467,984 | B2 | 6/2013 | Gering |
| 8,548,762 | B2 | 10/2013 | Prada et al. |
| 8,635,038 | B2 | 1/2014 | Benjamin et al. |
| 8,965,723 | B2 | 2/2015 | Jo et al. |
| 9,086,462 | B2 | 7/2015 | Mao |
| 2001/0032666 | A1* | 10/2001 | Jenson .................. A61N 1/3787 136/256 |
| 2003/0076109 | A1 | 4/2003 | Verbrugge et al. |
| 2004/0220758 | A1 | 11/2004 | Barsoukov et al. |
| 2006/0284600 | A1 | 12/2006 | Verbrugge |
| 2008/0281244 | A1* | 11/2008 | Jacobs .................. A61B 5/0002 602/41 |
| 2010/0033132 | A1 | 2/2010 | Nishi et al. |
| 2011/0025258 | A1 | 2/2011 | Kim et al. |
| 2011/0288797 | A1 | 11/2011 | Schmidt |
| 2012/0101753 | A1 | 4/2012 | Lin et al. |
| 2012/0150507 | A1 | 6/2012 | Gallestey et al. |
| 2013/0051587 | A1 | 2/2013 | Stephanou et al. |
| 2013/0085696 | A1 | 4/2013 | Xu et al. |
| 2014/0222358 | A1 | 8/2014 | Morita et al. |
| 2014/0229129 | A1 | 8/2014 | Campbelle et al. |
| 2014/0236511 | A1 | 8/2014 | Kulkarni et al. |
| 2014/0244225 | A1 | 8/2014 | Balasingam et al. |
| 2014/0278167 | A1 | 9/2014 | Frost et al. |
| 2014/0350877 | A1 | 11/2014 | Chow et al. |
| 2015/0046106 | A1 | 2/2015 | Wade et al. |
| 2015/0066406 | A1 | 3/2015 | Sun et al. |
| 2015/0147608 | A1 | 5/2015 | Lin et al. |
| 2015/0226807 | A1 | 8/2015 | Aumentado et al. |
| 2015/0234013 | A1 | 8/2015 | Migita et al. |
| 2015/0248149 | A1* | 9/2015 | Yamazaki ............. G06F 1/1635 361/679.27 |
| 2015/0251555 | A1 | 9/2015 | Li et al. |
| 2015/0251556 | A1 | 9/2015 | Meyer |
| 2015/0260800 | A1 | 9/2015 | Baba et al. |
| 2015/0268306 | A1 | 9/2015 | Sugiyama et al. |
| 2015/0326038 | A1 | 11/2015 | Lee |

FOREIGN PATENT DOCUMENTS

| | | |
|---|---|---|
| WO | WO 2006/057468 | 6/2006 |
| WO | WO 2008/154956 | 12/2008 |
| WO | WO 2014/130519 | 8/2014 |
| WO | WO 2015/056963 | 4/2015 |
| WO | WO 2015/056964 | 4/2015 |

OTHER PUBLICATIONS

International Search Report for Application No. PCT/EP2017/055241 dated May 11, 2017 (4 pages).
B. F. Lund and B. A. Foss, "Parameter ranking by orthogonalization—Applied to nonlinear mechanistic models," Automatica, vol. 44, No. 1, pp. 278-281, 2008.
Fuller et al., "Simulation and Optimization of the Dual Lithium Ion Insertion Cell," J. Electrochem. Soc., vol. 141, No. 1, Jan. 1994, pp. 1-10.
Ioannou et al., "Robust adaptive control." Courier Corporation, 2012.
K. Thomas, J. Newman and R. Darling, "Mathematical Modeling of Lithium Batteries," Kluwer Academic/Plenum Publishers, pp. 345-392, 2002.
Klein, R. et al., 2013. "Electrochemical Model Based Observer Design for a Lithium-Ion Battery." Control Systems Technology, IEEE Transactions on, 21(2), pp. 289-301.
M. Doyle, T.F. Fuller, J. Newman, "Modeling of Galvanostatic Charge and Discharge of the Lithium/Polymer/Insertion Cell", Journal of the Electrochemical Society, 1993.
Mayhew et al., "Investigation of projection-based model-reduction techniques for solid-phase diffusion in Li-ion batteries," American Control Conference (ACC), 2014 , pp. 123-128, Jun. 4-6, 2014.
Moura et al., "Adaptive PDE Observer for Battery SOC/SOH Estimation," ASME 2012 5th Annual Dynamic Systems and Control Conference joint with the JSME 2012 11th Motion and Vibration Conference, 2012 (10 pages).
Murray, Chapter 3, State Estimation, Caltech, (https://www.cds.caltech.edu/~murray/wiki/images/b/b3/Stateestim.pdf) available online as early as Sep. 20, 2006, pp. 9-17.
N. Chaturvedi, et al., "Modeling, estimation, and control challenges for lithium-ion batteries," 2010 American Control Conference, pp. 1997-2002, 2010.
N. Chaturvedi, J. Christensen, R. Klein and A. Kojic, "Approximations for Partial Differential Equations Appearing in Li-Ion Battery Models," ASME 2013 Dynamic Systems and Control Conference (10 pages).
N. Chaturvedi, R. Klein, J. Christensen, J. Ahmed and A. Kojic, "Algorithms for Advanced Battery Management Systems," IEEE Control Systems Magazine, vol. 30, No. 3, pp. 49-68, 2010.
Pattel, "An Evaluation of the Moving Horizon Estimation Algorithm for Online Estimation of Battery State of Charge and State," Thesis, Purdue University, Dec. 2014.
Ramadesigan et al., "Modeling and Simulation of Lithium-Ion Batteries from a Systems Engineering Perspective," Journal of The Elect rochemical Society, 1.59 (3) R3 1-R45 (2012).
Rao, C. V., Rawlings, J. B., & Mayne, D. Q. (2003). "Constrained state estimation for nonlinear discrete-time systems: Stability and moving horizon approximations." Automatic Control, IEEE Transactions, 48(2), 246-258.
Tenny, M. J., & Rawlings, J. B. (2002). "Efficient moving horizon estimation and nonlinear model predictive control." In American Control Conference, 2002. Proceedings of the 2002 (vol. 6, pp. 4475-4480). IEEE.
Thomas, "Lithium-Ion Batteries: Thermal and Interfacial Phenomena," Dissertation, Princeton University, 1996, published 2002, pp. 66-73.

* cited by examiner

BATTERY MANAGEMENT SYSTEM WITH MULTIPLE OBSERVERS

FIELD

The invention generally relates to secondary batteries, and more particularly to a method of managing the operation of a secondary battery.

BACKGROUND

Rechargeable lithium batteries are attractive energy storage devices for portable electric and electronic devices and electric and hybrid-electric vehicles because of their high specific energy compared to other electrochemical energy storage devices. A typical lithium cell contains a negative electrode, a positive electrode, and a separator located between the negative and positive electrodes. Both electrodes contain active materials that react with lithium reversibly. In some cases, the negative electrode may include lithium metal, which can be electrochemically dissolved and deposited reversibly.

Typically, during charging, electrons flow through an external circuit from the positive electrode to the negative electrode. Simultaneously, lithium ions deintercalate from the active material of the negative electrode to the electrolyte and intercalate from the electrolyte to the active material of the positive electrode. During discharging, opposite reactions occur.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure are related to systems and methods for managing the operation of a battery management system that estimates various states and parameters of a battery using multiple state observers.

One embodiment includes a method of managing a battery system, the battery system including one or more battery cells, one or more sensors coupled to the one or more battery cells and configured to measure one or more characteristics of the one or more battery cells, and a battery management system coupled to the one or more sensors and including a microprocessor and a memory. The method comprising receiving, by the battery management system, one or more measured characteristics of the one or more battery cells from the one or more sensors, receiving, by the battery management system, one or more estimated parameters of the one or more battery cells, estimating, by the battery management system, one or more states of the one or more battery cells by applying a first battery model to account for physical parameters of a chemical composition of the one or more battery cells based on the one or more measured characteristics and the one or more estimated parameters of the battery, updating, by the battery management system, at least a portion of the one or more estimated parameters based at least in part on the estimation of the one or more states of the one or more battery cells by applying two or more separate battery models to account for physical parameters of a chemical composition of the one or more battery cells, updating, by the battery management system, the one or more states of the one or more battery cells based at least in part on the updated estimated parameters of the one or more parameters of the one or more battery cells, and regulating by the battery management system, one or more of charging or discharging of the battery based on the updated estimation of the one or more states of the one or more battery cells.

Another embodiment includes a battery management system. The battery management system comprising a processor and a memory storing instructions that, when executed by the processor, cause the battery management system to receive one or more measured characteristics of one or more battery cells from one or more sensors, wherein the one or more battery cells and the one or more sensors are part of a battery system, receive one or more estimated parameters of the one or more battery cells, estimate one or more states of the one or more battery cells by applying a first battery model to account for physical parameters of a chemical composition of the one or more battery cells based on the one or more measured characteristics and the one or more estimated parameters of the battery, update at least a portion of the one or more estimated parameters based at least in part on the estimation of the one or more states of the one or more battery cells by applying two or more separate battery models to account for physical parameters of a chemical composition of the one or more battery cells, update the one or more states of the one or more battery cells based at least in part on the updated estimated parameters of the one or more parameters of the one or more battery cells, and regulate one or more of charging or discharging of the battery based on the updated estimation of the one or more states of the one or more battery cells.

The details of one or more features, aspects, implementations, and advantages of this disclosure are set forth in the accompanying drawings, the detailed description, and the claims below.

DETAILED DESCRIPTION

One or more specific embodiments will be described below. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
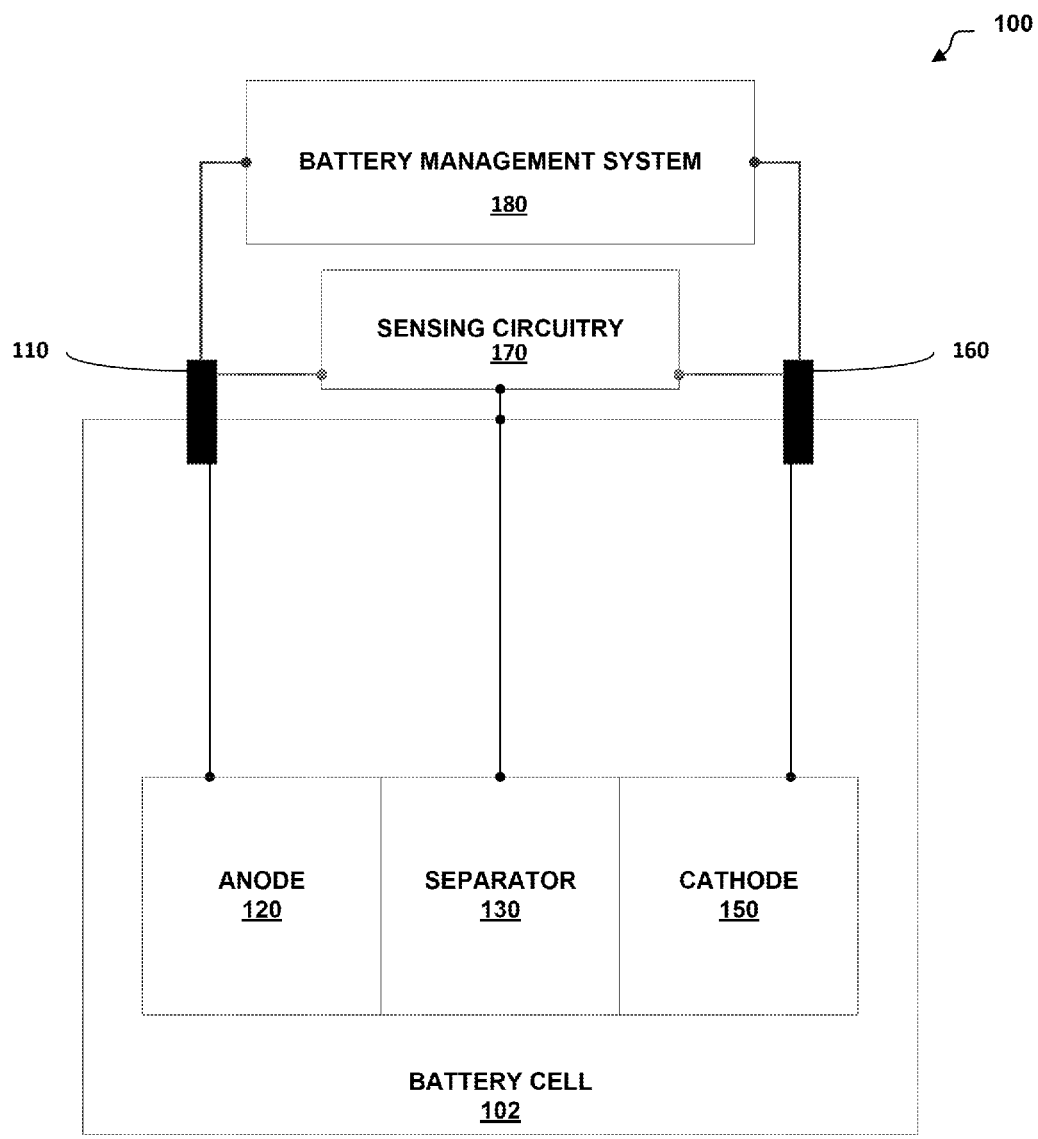
FIG. 1 is a block diagram of a battery system including a battery cell and a battery management system with sensing circuitry, in accordance with some embodiments.

An embodiment of a battery system 100 is shown in FIG. 1. The battery system 100 includes an anode tab 110, an anode 120, a separator 130, a cathode 150, a cathode tab 160, a sensing circuitry 170, and a battery management system 180. In some examples, the separator 130 may be an electrically insulating separator. In some embodiments, the electrically insulating separator comprises a porous polymeric film. In various embodiments the thickness dimension of the components of a battery cell 102 may be for the anode 120 about 5 to about 110 micrometers, for the separator 130 less than about 50 micrometers or in certain embodiments less than about 10 micrometers, and for the cathode 150 about 50 to about 110 micrometers.

During the discharge of the battery cell 102, lithium is oxidized at the anode 120 to form a lithium ion. The lithium ion migrates through the separator 130 of the battery cell 102 to the cathode 150. During charging the lithium ions return to the anode 120 and are reduced to lithium. The lithium may be deposited as lithium metal on the anode 120 in the case of a lithium anode 120 or inserted into the host structure in the case of an insertion material anode 120, such as graphite, and the process is repeated with subsequent charge and discharge cycles. In the case of a graphitic or other Li-insertion electrode, the lithium cations are combined with electrons and the host material (e.g., graphite), resulting in an increase in the degree of lithiation, or "state of charge" of the host material. For example, $x\,Li^+ + x\,e^- + C_6 \rightarrow Li_xC_6$.

The anode 120 may comprise an oxidizable metal, such as lithium or an insertion material that can insert Li or some other ion (e.g., Na, Mg, or other suitable ion). The cathode 150 may comprise various materials such as sulfur or sulfur-containing materials (e.g., polyacrylonitrile-sulfur composites (PAN-S composites), lithium sulfide ($Li_2S$)); vanadium oxides(e.g., vanadium pentoxide ($V_2O_5$)); metal fluorides (e.g., fluorides of titanium, vanadium, iron, cobalt, bismuth, copper and combinations thereof); lithium-insertion materials (e.g., lithium nickel manganese cobalt oxide (NMC), lithium-rich NMC, lithium nickel manganese oxide ($LiNi_{0.5}Mn_{1.5}O_4$)); lithium transition metal oxides (e.g., lithium cobalt oxide ($LiCoO_2$), lithium manganese oxide ($LiMn_2O_4$), lithium nickel cobalt aluminum oxide (NCA), and combinations thereof); lithium phosphates (e.g., lithium iron phosphate ($LiFePO_4$)).

The battery management system 180 is communicatively connected to the battery cell 102. In one example, the battery management system 180 is electrically connected to the battery cell 102 via electrical links (e.g., wires). In another example, the battery management system 180 may be wirelessly connected to the battery cell 102 via a wireless communication network. The battery management system 180 may include for example a microcontroller (with memory and input/output components on a single chip or within a single housing) or may include separately configured components, for example, a microprocessor, memory, and input/output components. The battery management system 180 may also be implemented using other components or combinations of components including, for example, a digital signal processor (DSP), an application specific integrated circuit (ASIC), a field-programmable gate array (FPGA), or other circuitry. Depending on the desired configuration, the processor may include one or more levels of caching, such as a level cache memory, one or more processor cores, and registers. The example processor core may include an arithmetic logic unit (ALU), a floating point unit (FPU), or any combination thereof. The battery management system 180 may also include a user interface, a communication interface, and other computer implemented devices for performing features not defined herein may be incorporated into the system. In some examples, the battery management system 180 may include other computer implemented devices such as a communication interface, a user interface, a network communication link, and an interface bus for facilitating communication between various interface devices, computing implemented devices, and one or more peripheral interfaces to the microprocessor.

In the example of FIG. 1, a memory of the battery management system 180 stores computer-readable instructions that, when executed by the electronic processor of the battery management system 180, cause the battery management system and, more particularly the electronic processor, to perform or control the performance of various functions or methods attributed to battery management system 180 herein (e.g., receive measured characteristics, receive estimated characteristics, calculate a state or parameter of the battery system, apply multiple battery models and observers, regulate the operation of the battery system). The memory may include any transitory, non-transitory, volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital or analog media. The functions attributed to the battery management system 180 herein may be embodied as software, firmware, hardware or any combination thereof. In one example, the battery management system 180 may be embedded in a computing device and the sensing circuity 170 is configured to communicate with the battery management system 180 of the computing device external to the battery cell 102. In this example, the sensing circuitry 170 is configured to have wireless and/or wired communication with the battery management system 180. For example, the sensing circuitry 170 and the battery management system 180 of the external device are configured to communicate with each other via a network. In yet another example, the battery management system 180 is remotely located on a server and the sensing circuitry 170 is configured to transmit data of the battery cell 102 to the battery management system 180. In the above examples, the battery management system 180 is configured to receive the data and send the data to an electronic device for display as human readable format. The computing device may be a cellular phone, a tablet, a personal digital assistant (PDA), a laptop, a computer, a wearable device, or other suitable computing device. The network may be a cloud computing network, a server, a wireless area network (WAN), a local area network (LAN), an in-vehicle network, a cloud computing network, or other suitable network.

The battery management system 180 is configured to receive data from the sensing circuitry 170 including current, voltage, temperature, and/or resistance measurements. Battery management system 180 is also configured to determine a condition of the battery cell 102. Based on the determined condition of battery cell 102, the battery management system 180 may alter the operating parameters of the battery cell 102 to maintain the internal structure of the battery cell 102. The battery management system 180 may also notify a user of the condition of the battery cell 102.

In some embodiments the battery cell 102 may be closed system. In such a system after the battery cell 102 is produced the casing is sealed to prevent external elements, such as air and moisture, from entering the battery cell 102 and potentially causing degradation of components resulting in reduced performance and shorter life.

However, a closed battery cell 102 presents various challenges to the battery management system 180. The closed system does not allow the direct observation of the condition of the components of the battery cell 102. Instead, conditions as monitored and measured by the sensing circuitry 170 may be processed or evaluated to determine various characteristics of the battery cell 102, such as voltage, current, resistance, power, temperature and combinations thereof, during operation or while at rest, and pass those measured characteristics to a battery management system 180 which can interpret the measured characteristics in order to determine the condition of the battery cell 102.

A state observer is a system that provides an estimate of the internal states of a system, from measurements of the inputs and outputs of the system. State observers typically include a model of the system and an estimation algorithm for determining the internal states based on the external observations. The complexity of the system models and estimation algorithms are directly related to the computational complexity of implementing the state observer.

Figure 2:
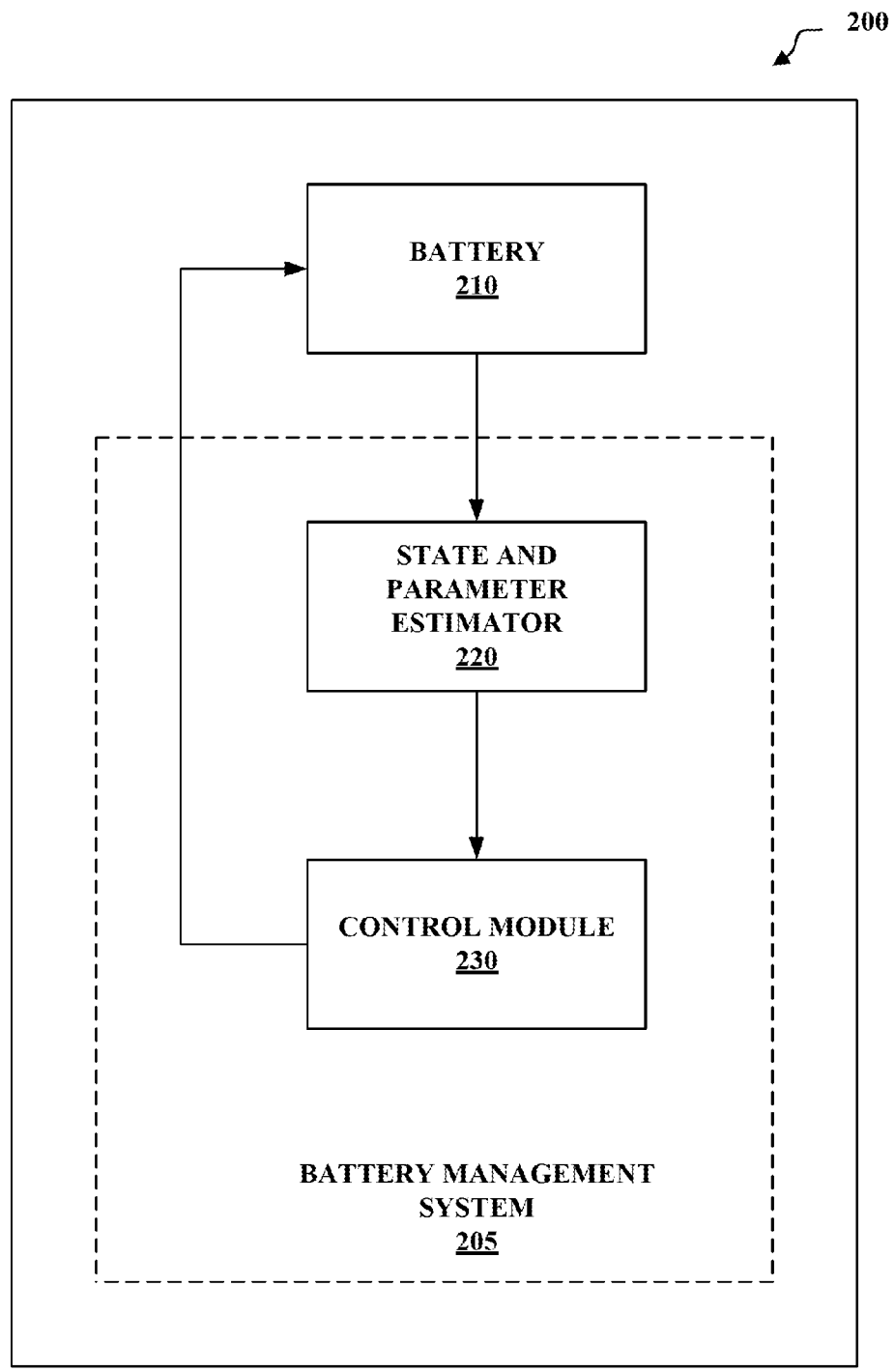
FIG. 2 is a block diagram of a battery system including a battery and battery management system with a state and parameter estimator and a control module in accordance with some embodiments.

An embodiment of a battery system 200 is shown in FIG. 2. The battery system 200 includes a battery management system 205 which receives inputs from sensing circuitry 170 of the condition of a battery 210. The state and parameter estimator 220 of the battery management system 205 estimates one or more states and/or parameters of the battery 210 based on the inputs from the sensing circuitry 170. The estimates of the states and parameters of the battery 210 are sent to a control module 230 which then regulates the operation of the battery 210. In some embodiments the battery 210 includes one or more battery cells 102 as described above.

Figure 3:
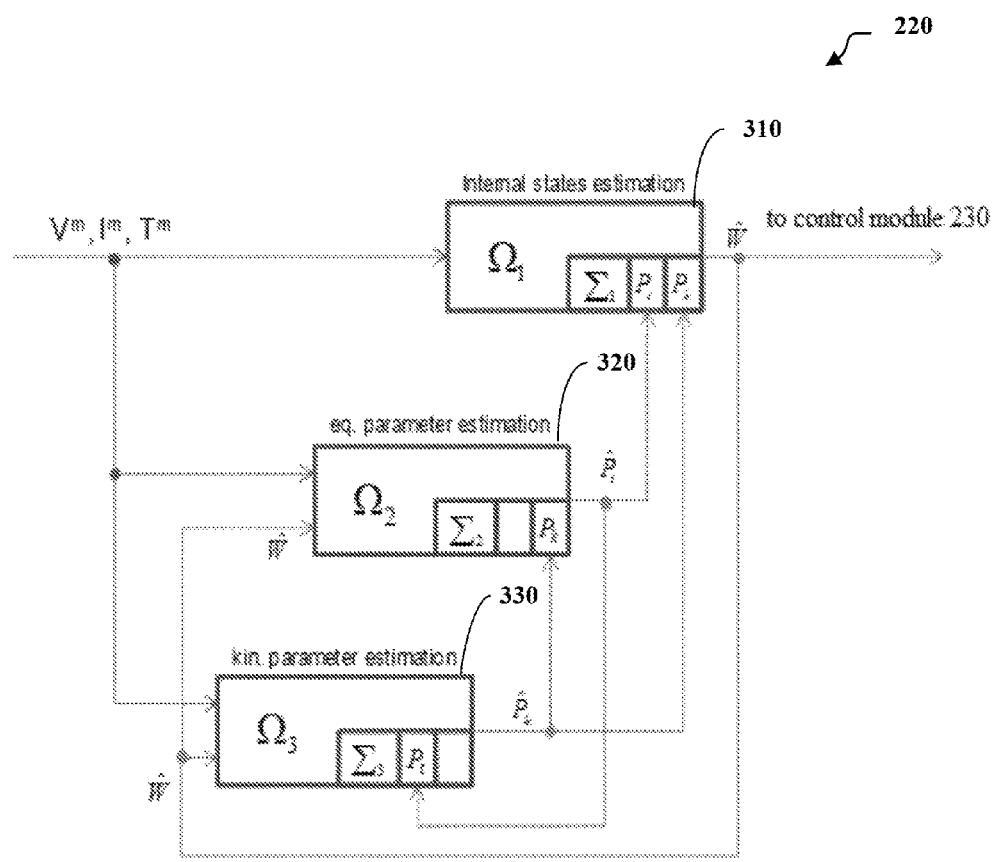
FIG. 3 is a functional block diagram of a battery system that applies a combined estimation structure to jointly estimate both physical parameters of the battery cell and battery state information, in accordance with some embodiments.

FIG. 3 is block diagram illustrating an embodiment of a state and parameter estimation system 220 of FIG. 2. In some embodiments, the state and parameter estimator 220 includes a first state observer 310, a second state observer 320, and a third state observer 330.

The first state observer 310 (illustrated as $\Omega_1$ in FIG. 3) includes a detailed battery model $\Sigma_1$ that estimates the internal states of the battery 210. In some embodiments, the battery model $\Sigma_1$ includes an electrochemical model of the battery cell 102. The internal states of the $\Sigma_1$ battery model, are summarized in the state vector W (e.g., lithium concentration distribution in the electrolyte, lithium concentration distribution in the solid phase, potential distribution in the electrolyte, potential distribution in the solid phase, ionic current distribution in the electrolyte, electronic current distribution in the solid phase, molar flux distribution between electrolyte and solid phase, internal temperature). The input to the model $\Sigma_1$ of the first state observer 310 includes the applied current I and the ambient temperature $T_{amb}$. The measured output of the battery model $\Sigma_1$ includes the voltage V, which is a simple linear algebraic expression of the internal states W. The battery model $\Sigma_1$ has parameters P, which are assumed to be known at the beginning of life. These parameters, however, change over the lifespan of the battery cell 102 due to various aging phenomena associated with the battery cell 102.

In certain embodiments, the first state observer 310 is designed to run in real-time using approaches described herein. For example, the output errors between measured and predicted outputs are injected back into the first state observer 310 at appropriate locations such that the estimated states quickly converge to the true internal states of the battery 210. Alternative methods for obtaining internal state estimates could also be based on Kalman filtering theory (extended KF, unscented KF, sigma point KF, iterated KF, etc.), moving horizon estimator theory, or other applicable methods. An important feature of the first state observer 310 is its robustness with respect to uncertain kinetic parameters.

The battery models described above assume knowledge of the model parameters at all times. The model parameters are continuously changing due to undesired processes occurring within the battery cells 102. In order to track the changing parameters over time one or more parameter estimation algorithms can be employed. In the example of FIG. 3 the parameters of the first state observer 310 are separated into groups based on the sensitivity of internal state estimation with respect to parameter uncertainty. For example, the battery model $\Sigma_1$ parameters may be grouped into kinetic parameters $P_k$ and thermodynamic parameters $P_t$. Thermodynamic parameters $P_t$ describe the equilibrium structure of the battery model $\Sigma_1$. Thermodynamic parameters can vary due to changing conditions during operation of the battery 210 (e.g., due to changes in the internal temperature of the battery 210). Thus, the first state observer 310 will be sensitive to uncertainties in the thermodynamic parameters $P_t$. As illustrated in FIG. 3, the first state observer 310 receives measured signals (e.g., a measured voltage signal $V^M$, a measured current signal $I^M$, and a measured temperature signal $T^M$) and estimates of the thermodynamic and kinetic parameters from the second state observer 320 and the third state observer 330, respectively, and estimates the internal states vector $\hat{W}$.

The second state observer 320 (illustrated as $\Omega_2$ in FIG. 3) receives the measured signals as described above, the state vector $\hat{W}$ from the first state observer 310, and the kinetic parameters $P_k$ from the third state observer 330 and estimates the thermodynamic parameters $P_t$ using a less complex second battery model $\Sigma_2$ to describe the battery cell 102 (e.g., the single particle model as described herein). The main requirement of the second battery model $\Sigma_2$ is that it has the exact same equilibrium structure as the first battery model $\Sigma_1$, and thus the second battery model $\Sigma_2$ shares the same thermodynamic parameters $P_t$. The second state observer 320 is operated simultaneously with the first state observer 310 and estimates a subset of the averaged internal states (which also appear in $\Sigma_1$) in addition to the parameters $P_t$. In this case, the thermodynamic parameters $P_t$ are part of the state vector for the second state observer 320 in contrast to being part of the parameter vector for the first state observer 310. The second state observer 320 forms a loop with the first state observer 310 and the third state observer 330 and provides the estimated thermodynamic parameters $P_t$ to the first state observer 310 and the third state observer 330.

The third state observer 330 (illustrated as $\Omega_3$ in FIG. 3) receives the measured signals as described above, the state vector $\hat{W}$ from the first state observer 310, and the thermodynamic parameters $P_t$ from the second state observer 320 and estimates the kinetic parameters $P_k$. The basis for the third state observer 330 is a third battery model $\Sigma_3$, whose structure is derived from the input-output behavior of the first battery model $\Sigma_1$. The third state observer 330 forms a loop with the first state observer 310 and the second state observer 320 and provides the estimated kinetic parameters to the first state observer 310 and the second state observer 320.

The three state observers 310, 320, and 330 are tuned such that the speed of convergence is fastest for the first state observer 310, followed by the second state observer 320, and finally the third state observer 330. In some embodiments, the second state observer 320 and the third state observer 330 can incorporate knowledge of parameter changes based on first principle aging models.

As illustrated in FIG. 3, the first state observer 310 provides the control module 230 of the battery management system 205 with up-to-date estimates of internal states $\hat{W}$ based on the model $\Sigma_1$, the measured signals (e.g., a measured voltage signal $V^m$, a measured current signal $I^m$, and a measure temperature signal $T^m$), and the estimated parameter values $\hat{P}F_t$ and $\hat{P}_k$ as described above. The second state observer 320 and the third state observer 330 update the estimated parameter values in $\hat{P}_t$ and $\hat{P}_k$ using the measured signals $V^m$, $I^m$, and $T^m$, and the estimated internal states $\hat{W}$ based on the second and third battery models $\Sigma_2$ and $\Sigma_3$, respectively.

The first state observer 310 includes the first battery model $\Sigma_1$ of the one or more battery cells 102 (e.g., electrochemical model, thermodynamic model, kinetic model, equivalent circuit model), and an estimation algorithm (e.g., Kalman filter, Moving Horizon Estimation, Least Squares Estimation) which can be used to estimate one or more states and/or parameters of the battery cell 102. The first state observer 310 exhibits a first computational complexity based on the first battery model $\Sigma_1$ and estimation algorithm.

The second state observer 320 includes the second battery model $\Sigma_2$ of the one or more battery cells 102 (e.g., electrochemical model, thermodynamic model, kinetic model, equivalent circuit model), and an estimation algorithm (e.g., Kalman filter, Moving Horizon Estimation, Least Squares Estimation) which can be used to estimate one or more states and/or parameters of the battery cell 102. The second state observer 320 exhibits a second computational complexity based on the second battery model $\Sigma_2$ and estimation algorithm.

The third state observer 330 includes the third battery model $\Sigma_3$ of the one or more battery cells 102 (e.g., electrochemical model, thermodynamic model, kinetic model, equivalent circuit model), and an estimation algorithm (e.g., Kalman filter, Moving Horizon Estimation, Least Squares Estimation) which can be used to estimate one or more states and/or parameters of the battery cell 102. The third state observer 330 exhibits a third computational complexity based on the third battery model $\Sigma_3$ and estimation algorithm.

In order to reduce the overall computational load on the battery management system 205 the battery models and/or estimation algorithms of the state observers 310-330 may be selected in order to reduce the overall computational complexity of the state and/or parameter estimation. In some embodiments the first computational complexity is greater than the second computational complexity. In some embodiments the second computational complexity is greater than the third computational complexity. In certain embodiments the first computational complexity is greater than the second computational complexity and the second computational complexity is greater than the third computational complexity.

In certain embodiments, the three state observers are tuned such that the speed of convergence is fastest for the first state observer 310, followed by the second state observer 320, and finally the third state observer 330. As described above, the state observers 310-330 receive one or more measured voltages $V^{th}$, one or more measured currents $I^m$, and/or one or more measured $T^m$ from one or more battery cells 102. The first state observer 310 estimates a state vector $\hat{W}$ and sends the estimate of $\hat{W}$ to the second state observer 320 and third state observer 330. The second state observer 320 estimates one or more of the thermodynamic parameters included in the battery model of the first state observer 310 and sends the estimate to the first state observer 310 and the third state observer 330. The third state observer 330 estimates one or more of the kinetic parameters included in the battery model of the first state observer 310 and sends the estimate to the first state observer 310 and second state observer 320. The first state observer 310 using the measured inputs and the outputs from the second state observer 320 and third state observer 330 provides an updated state estimate $\hat{W}$ to the control module 230. In certain embodiments, the state observers 310-330 may further include information of parameter changes based on first principle aging models.

In some embodiments, the state and parameter estimator 220 may include the state and parameter estimation system 300. As illustrated in FIG. 3, the state and parameter estimation system 300 sends the estimated states and/or parameters to the control module 230. The control module 230 as described above in FIG. 2 regulates the operation of the battery 210 as described above in FIG. 2 based at least in part on the estimated states and/or parameters received from the state and parameter estimation system 300.

Various models have been developed to model the electrochemical reactions occurring within the battery cell 102. One example, was developed by Fuller, Doyle, and Newman, (the Newman Model), (*J. Electrochem. Soc.*, Vol. 141, No. 1, January 1994, pp. 1-10), the contents of which are hereby incorporated by reference in their entirety. The Newman Model provides a mathematical model which can be used to estimate the electrochemical processes occurring within the battery cell 102 based on the measured characteristics.

The charge transfer reactions at the anode 120, and cathode 150, may be modelled by an electrochemical model, such as the Newman Model, providing the basis to describe various battery cell 102 parameters during both the charging and discharging of the battery cell 102. For example, the Newman Model may allow the estimation of various parameters including cathode particle radius, which can vary due to the degree of lithiation of the cathode 150, which also may be called the state-of-charge of the battery cell 102, anode particle radius, ion diffusion rates in the anode 120, cathode 150, and electrolyte, intercalation current and transference number, solution conductivity in the anode 120, cathode 150, and electrolyte, cell porosity of the anode 120 and cathode 150, and equilibrium potential of the anode 120 and cathode 150.

Physics based electrochemical models, such as the Newman Model, may include ordinary and partial differential equations (PDEs) to describe the behavior of the various parameters within the battery cell 102. The Newman Model is an electrochemical-based model of the actual chemical and electrical processes occurring in the Li-ion batteries. However, the full Newman Model is extremely complex and requires a large number of immeasurable physical parameters to be identified. Identification of such large set of parameters involved in the nonlinear PDE and differential algebraic equations (DAEs) with current computational capacity is impractical. This gives rise to various electrochemical models that approximate the dynamics of the Newman Model.

For example, the Reduced-Order-Model (ROM), Mayhew, C.; Wei He; Kroener, C.; Klein, R.; Chaturvedi, N.; Kojic, A., "Investigation of projection-based model-reduction techniques for solid-phase diffusion in Li-ion batteries," American Control Conference (ACC), 2014, pp. 123-128, 4-6 Jun. 2014, the contents of which are hereby incorporated by reference in their entirety, allows the model order reduction of the Newman Model of Li-ion cells while retaining the complete model structure of the of the baseline cell. The ROM of the Newman Model is able to accurately predict behavior of a truth model, while reducing computation time and memory requirements. This contributes to the complexity of the parameter and state identification process.

In some embodiments less computationally complex battery models (e.g., equivalent circuit model, single particle model) may be used to model the states and parameters of the battery cell 102. In a further embodiment both electrochemical and non-electrochemical models can be used in combination to describe the operation and condition of the battery cell 102.

For example, the Single Particle Model, Chaturvedi et al., "Modeling, estimation, and control challenges for Li-ion batteries" 2010 American Control Conference Marriott Waterfront, Baltimore, Md., USA June 30-Jul. 2, 2010, the contents of which are hereby incorporated by reference in their entirety, describes a reduction in the computational complexity of electrochemical models, such as the Newman Model, by assuming uniform local parameters across the electrodes allowing a porous electrode to be modelled as a collection of single particles experiencing uniform conditions. The Single Particle Model includes the same equilibrium structure as a more complex electrochemical model while reducing computation time and memory requirements.

Various methods can be used for state and parameter estimation (e.g., Extended Kalman filter, Unscented Kalman filter, Sigma point Kalman filter, Iterated Kalman filter, Moving Horizon Estimation, Reduced Least Squares Estimation, Ordinary Least Squares Estimation, Non-Linear Least Squares Estimation, Polynomial Least Squares Estimation, or other applicable methods). The various estimation methods may be used alone or in combination to estimate the states and parameters of the battery cell 102.

In one example, an Extended Kalman Filter (EKF) describes the process model as a nonlinear time varying model in discrete time, but uses a local linearization at each time step. The set of outputs from the electrochemical model via the Extended Kalman Filter (EKF) can include estimation of both rapidly varying states of the battery cell 102 and estimation of slowly varying parameters of the battery cell 102. In some embodiments the state of the battery cell 102 in combination with the present input to the mathematical model allows the model to predict the present output of the battery cell 102. States of a battery cell may for example include the state-of-charge (e.g., for a lithium battery the degree of lithiation) or overpotentials. Parameters of the battery cell 102 typically vary more slowly over time than the states of the battery cell 102. Information of the parameters of battery cell, which may be called the state-of-health of the battery, relate to the long term functioning of the battery cell 102. Additionally, some embodiments comprise parameters which are not directly determinable from the measurement of the current battery cell 102 characteristics (e.g., volume fractions of active materials in the anode 120 and cathode 150, total cyclable lithium in the battery cell 102, electrolyte conductivity and radii of particles in the anode 120 and cathode 150).

Additionally, the Moving Horizon Estimation (MHE) method is a model predictive estimator which can be used by a controller (e.g., a controller that operates as a battery management system) to solve an open-loop control problem by using the current states and parameters of the modeled system as the initial states of the modeled system at the next discrete time interval. Predictive estimators, such as the Moving Horizon Estimation (MHE) method, use a moving window of the most recent information and carry over the last estimate to the next time instant. Moving Horizon Estimation (MHE) uses a series of continuously sampled measurements over time to estimate the states and parameters of the system. The measurements may contain noise in addition to the measurement. The states, parameters, and noise may be estimated by solving the mathematical model within a set of constraints.

The MHE method seeks to minimize the difference (error) between the estimated value of the characteristic and the actual measured value of the characteristic over a series of discrete time measurements collected over a predetermined time horizon. That is, a cost function of the MHE method is composed of the deviation of the estimated output (e.g., an error between the measured characteristic and the estimated characteristic) from the measured output and an arrival cost that assumes a weight on the previously estimated states and parameters.

The arrival cost summarizes the effect of the previously measured and estimated data on the current estimation. For a linear unconstrained system or systems, a Kalman Filter covariance update formula can compute the arrival cost explicitly. However, a non-linear unconstrained system can be linearized at the currently estimated point and removing the constraints, and then the Kalman Filter can be employed to the approximated system. This application of the Kalman Filter to the approximated system is defined as an Extended Kalman Filter (EKF).

To apply the MHE method to the ROM dynamical system, a battery management system (e.g., the battery management system 180 or 205 as described above) can determine an arrival cost gain for each parameter based on its estimation robustness. The arrival cost gain may be modeled as time varying or time invariant. Additionally, the battery management system can characterize the effect of parameters identifiability in the estimation process and suspension of estimation under low excitation.

To determine an arrival cost gain for each parameter, the battery management system 180 can use a Kalman Filter based method. In the implementation of the Kalman Filter based method in an arrival cost of the MHE method, the battery management system 180 may assume that the probability density functions of the noises in states, parameters and output are shape invariant Gaussian distributions, that is, Gaussian distributions with time-invariant covariance matrices. However, battery cells 102 undergo varying discharge, charge, and idle operations during relatively short time periods as the vehicle accelerates, decelerates, and stops during operation. From simulation and empirical data, different parameters and states of the Reduced Order Model (ROM) of Li-ion battery have different noise levels and different influence on the output and their noise and influence levels depend on the battery's state of operation. Accordingly, the battery management system may assume that the noise covariance matrix in estimation of states and parameters is a time-varying matrix that depends on the sensitivity of output on states and parameters at each horizon. Thus, the battery management system 180 may employ different notions of states and parameters' sensitivity such as partial derivatives of output versus states and parameters and variations in the output over one drive cycle due to perturbation in states and parameters.

Additionally, the battery management system 180 may also define a direct relation between noise covariance matrix and the sensitivity of output on parameters and states. The noise covariance matrix has an inverse relation with the arrival cost gains. For example, if the sensitivity of a parameter or state is gradually decreasing over a drive or charge cycle, then the entries in the noise covariance matrix associated with that parameter or state will also decrease which results in an increase in the associated arrival cost gain. If the arrival cost gain increases then the rate of change in that parameter or state during the prediction phase decreases and hence the parameter or state will have a higher tendency to retain its current value. The battery management system 180 may use this inverse relationship to create an automatic estimation suspension mechanism which smoothly takes the focus away from the estimation of one or more parameters and/or states.

To identify states and parameters, the battery management system 180 may employ various methods. For example, the battery management system 180 suspends the estimation process, that is, the battery management system sets the parameters equal to the last identified values and predicted states according to the system dynamics under a low input persistency of excitation. In this example, the battery management system may define an input persistency of excitation to be an integration of a power gain of a current over the estimation time horizon. In another example, the battery management system may suspend the estimation of one or more parameters under low gradient of output or states function versus those parameters.

Figure 4:
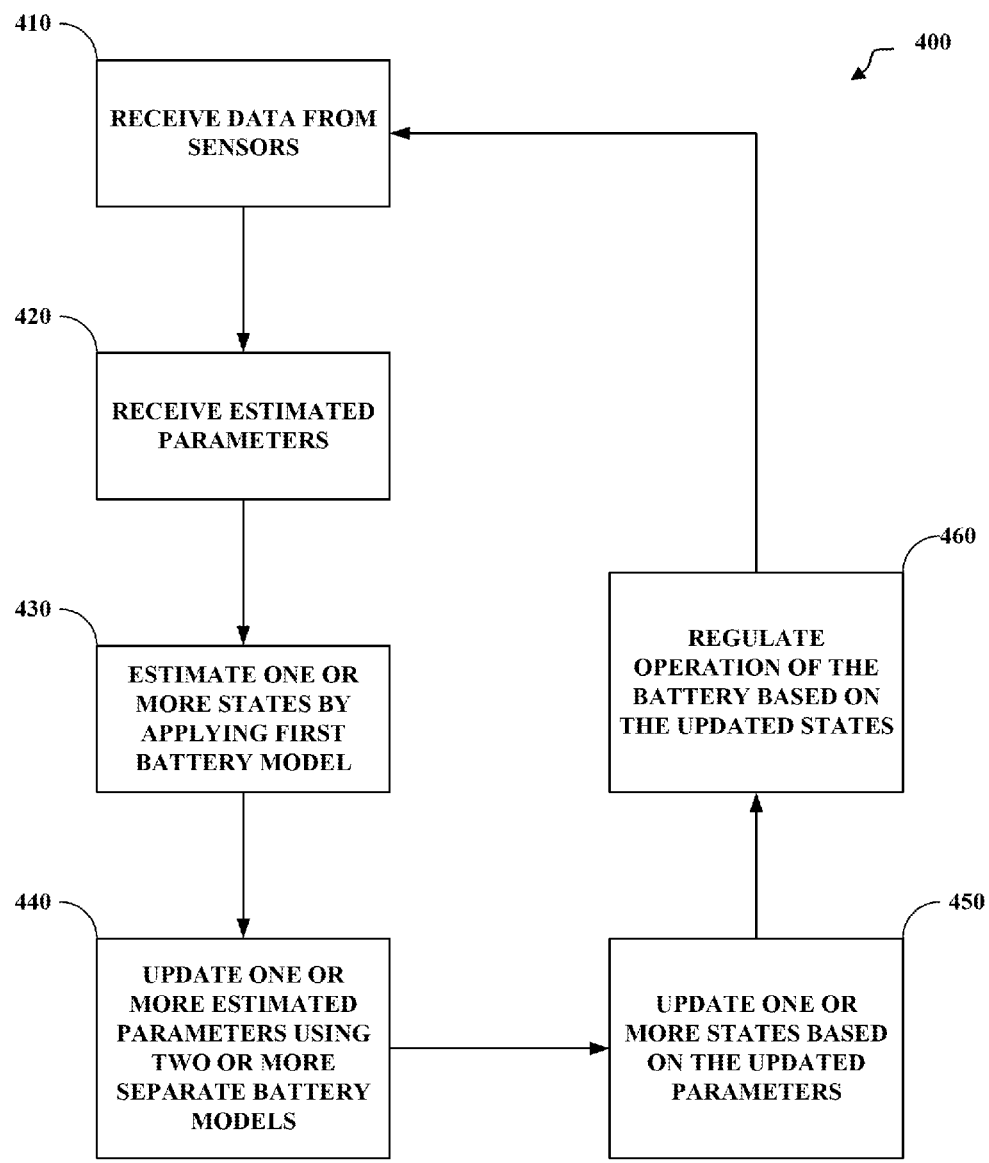
FIG. 4 is a flowchart of a method of determining states and parameters of a battery using multiple state observers, in accordance with some embodiments.

FIG. 4 is a flowchart of a method 400 of managing the operation of a battery system using multiple state observers. In the example of FIG. 4, at block 410, the battery management system 180 receives data from one or more sensors 170 which measure one or more characteristics of one or more battery cells 102. At block 420, the battery management system 180 receives one or more estimated parameters of the one or more battery cells 102. At block 430, the battery management system 180 estimates one or more states of the one or more battery cells by applying a first battery model to account for physical parameters of a chemical composition of the one or more battery cells 102 based on the one or more measured characteristics of the battery 210 and the one or more estimated parameters of the battery 210. At block 440, the battery management system 180 updates at least a portion of the one or more estimated parameters based at least in part on the estimation of the one or more states of the one or more battery cells 102 by applying two or more separate battery models to account for physical parameters of a chemical composition of the one or more battery cells 102. At block 450, the battery management system 180 updates the one or more states of the one or more battery cells 102 based at least in part on the updated estimated parameters of the one or more parameters of the one or more battery cells 102. At block 460, the battery management system 180 regulates one or more of charging or discharging of the battery based on the updated estimation of the one or more states of the one or more battery cells 102.

In some embodiments, the first battery model comprises an electrochemical-based battery model based on differential algebraic equations. In some embodiments, estimating, by the battery management system, one or more states of the one or more battery cells by applying the electrochemical-based battery model that applies differential algebraic equations to account for physical parameters of a chemical composition of the one or more battery cell includes applying a Kalman filter, a Moving Horizon Estimation, or a Least Squares Estimation. In certain embodiments, the Kalman filter is selected from the list consisting of an extended Kalman filter, an unscented Kalman filter, a sigma point Kalman filter, and an iterated Kalman filter. In certain embodiments, the Least Squares Estimation is selected from the list consisting of a Reduced Least Squares Estimation, an Ordinary Least Squares Estimation, a Non-Linear Least Squares Estimation, and a Polynomial Least Squares Estimation. In some embodiments, the first battery model includes an electrochemical-based Reduced-Order-Model of a Newman model. In some embodiments, the two or more separate battery models includes an equivalent circuit model, a single particle model, or an electrochemical-based battery model based on differential algebraic equations. In some embodiments, updating, by the battery management system, one or more states of the one or more battery cells, applies a Kalman filter, a Moving Horizon Estimation, or a Least Squares Estimation. In some embodiments, the one or more state of the one or more battery cells includes one or more of a state-of-charge or a state-of-health of the one or more battery cells. In some embodiments, the one or more sensors are further configured to measure a voltage, and a current of the one or more battery cells, the method further comprising receiving, by the battery management system from the one or more sensors, a measurement of the voltage of the one or more battery cell and a temporally corresponding measurement of the current of the one or more battery cells. In some embodiments, estimating by the battery management system, one or more states of the one or more battery cells by applying the first battery model is based at least in part on the updated parameters estimated by the battery management system by applying the two or more separate battery models. In some embodiments, the two or more separate battery models include one or more of an equivalent circuit model, a single particle model, or an electrochemical-based battery model based on differential algebraic equations. In some embodiments, the two or more separate battery models includes a second battery model and a third battery model and estimating by the battery management system, one or more parameters of the one or more battery cells by applying the two or more separate battery models includes estimating by the battery management system, one or more parameters of the one or more battery cells by applying the second battery model based on the parameters estimated by the battery management system by applying the third battery model. In certain embodiments, estimating by the battery management system, one or more states of the one or more battery cells by applying the first battery model is based on the parameters estimated by the battery management system by applying the second battery model and the parameters estimated by the battery management system by applying the third battery model. In some embodiments, applying two or more separate battery models to account for physical parameters of a chemical composition of the one or more battery cells includes applying a Kalman filter, a Moving Horizon Estimation, or a Least Squares Estimation.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the spirit and scope of this disclosure.

What is claimed is:

1. A method of managing a battery system, the battery system including one or more battery cells, one or more sensors coupled to the one or more battery cells and configured to measure one or more characteristics of the one or more battery cells, and a battery management system coupled to the one or more sensors and including a microprocessor and a memory, the method comprising:

receiving, by the battery management system, one or more measured characteristics of the one or more battery cells from the one or more sensors;

receiving, by the battery management system, one or more estimated parameters of the one or more battery cells;

estimating, by the battery management system, one or more states of the one or more battery cells by applying a first battery model to account for physical parameters of a chemical composition of the one or more battery cells based on the one or more measured characteristics and the one or more estimated parameters of the one or more battery cells;

updating, by the battery management system, at least a portion of the one or more estimated parameters based at least in part on the estimation of the one or more states of the one or more battery cells by applying two or more separate battery models to account for physical parameters of a chemical composition of the one or more battery cells;

updating, by the battery management system, the one or more states of the one or more battery cells based at least in part on the updated estimated parameters of the one or more parameters of the one or more battery cells; and regulating, by the battery management system, one or more of charging or discharging of the battery based on the updated estimation of the one or more states of the one or more battery cells.

2. The method of claim 1, wherein the first battery model comprises an electrochemical-based battery model based on differential algebraic equations.

3. The method of claim 2, wherein estimating, by the battery management system, one or more states of the one or more battery cells by applying the electrochemical-based battery model that applies differential algebraic equations to account for physical parameters of a chemical composition of the one or more battery cells includes applying a Kalman filter, a Moving Horizon Estimation, or a Least Squares Estimation.

4. The method of claim 3, wherein the Kalman filter is selected from the group consisting of an extended Kalman filter, an unscented Kalman filter, a sigma point Kalman filter, and an iterated Kalman filter.

5. The method of claim 3, wherein the Least Squares Estimation is selected from the group consisting of a Reduced Least Squares Estimation, an Ordinary Least Squares Estimation, a Non-Linear Least Squares Estimation, and a Polynomial Least Squares Estimation.

6. The method of claim 1, wherein the first battery model includes an electrochemical-based Reduced-Order-Model of a Newman model.

7. The method of claim 1, wherein the two or more separate battery models includes an equivalent circuit model, a single particle model, or an electrochemical-based battery model based on differential algebraic equations.

8. The method of claim 1, wherein updating, by the battery management system, the one or more states of the one or more battery cells includes applying a Kalman filter, a Moving Horizon Estimation, or a Least Squares Estimation.

9. The method of claim 1, wherein the one or more states of the one or more battery cells includes one or more of a state-of-charge or a state-of-health of the one or more battery cells.

10. The method of claim 1, wherein the one or more sensors are further configured to measure a voltage, and a current of the one or more battery cells, the method further comprising receiving, by the battery management system from the one or more sensors, a measurement of the voltage of the one or more battery cells and a temporally corresponding measurement of the current of the one or more battery cells.

11. The method of claim 1, wherein estimating by the battery management system, one or more states of the one or more battery cells by applying the first battery model is based at least in part on the updated parameters estimated by the battery management system by applying the two or more separate battery models.

12. The method of claim 1, wherein the two or more separate battery models include one or more of an equivalent circuit model, a single particle model, or an electrochemical-based battery model based on differential algebraic equations.

13. The method of claim 1, wherein the two or more separate battery models includes a second battery model and a third battery model and estimating by the battery management system, one or more parameters of the one or more battery cells by applying the two or more separate battery models includes estimating by the battery management system, one or more parameters of the one or more battery cells by applying the second battery model based on the parameters estimated by the battery management system by applying the third battery model.

14. The method of claim 13, wherein estimating by the battery management system, one or more states of the one or more battery cells by applying the first battery model is based on the parameters estimated by the battery management system by applying the second battery model and the parameters estimated by the battery management system by applying the third battery model.

15. The method of claim 1, wherein applying two or more separate battery models to account for physical parameters of a chemical composition of the one or more battery cells includes applying a Kalman filter, a Moving Horizon Estimation, or a Least Squares Estimation.

16. A battery management system comprising a processor and a memory storing instructions that, when executed by the processor, cause the battery management system to:

receive one or more measured characteristics of one or more battery cells from one or more sensors, wherein the one or more battery cells and the one or more sensors are part of a battery system;

receive one or more estimated parameters of the one or more battery cells;

estimate one or more states of the one or more battery cells by applying a first battery model to account for physical parameters of a chemical composition of the one or more battery cells based on the one or more measured characteristics and the one or more estimated parameters of the one or more battery cells;

update at least a portion of the one or more estimated parameters based at least in part on the estimation of the one or more states of the one or more battery cells by applying two or more separate battery models to account for physical parameters of a chemical composition of the one or more battery cells;

update the one or more states of the one or more battery cells based at least in part on the updated estimated parameters of the one or more parameters of the one or more battery cells; and regulate one or more of charging or discharging of the battery based on the updated estimation of the one or more states of the one or more battery cells.

17. The battery management system of claim 16, wherein the first battery model comprises an electrochemical-based battery model based on differential algebraic equations; and wherein estimate one or more states of the one or more battery cells by applying the first battery model includes applying a Kalman filter, a Moving Horizon Estimation, or a Least Squares Estimation.

18. The battery management system of claim 16, wherein applying two or more separate battery models to account for physical parameters of a chemical composition of the one or more battery cells includes applying a Kalman filter, a Moving Horizon Estimation, or a Least Squares Estimation.

19. The battery management system of claim 16, wherein estimate one or more states of the one or more battery cells by applying the first battery model is based at least in part on the updated parameters estimated by the battery management system by applying the two or more separate battery models.

20. The battery management system of claim 16, wherein the two or more separate battery models includes a second battery model and a third battery model and estimate one or more parameters of the one or more battery cells by applying the two or more separate battery models includes estimate one or more parameters of the one or more battery cells by applying the second battery model based on the parameters estimated by applying the third battery model.

* * * * *